(12) United States Patent
Kang et al.

(10) Patent No.: US 8,866,706 B2
(45) Date of Patent: Oct. 21, 2014

(54) ORGANIC ELECTROLUMINESCENT DISPLAY DEVICE AND MANUFACTURING METHOD OF THE SAME

(75) Inventors: Ki-Nyeng Kang, Yongin (KR); Na-Young Kim, Yongin (KR); Yong-Sung Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 654 days.

(21) Appl. No.: 13/075,123

(22) Filed: Mar. 29, 2011

(65) Prior Publication Data

US 2012/0001885 A1   Jan. 5, 2012

(30) Foreign Application Priority Data

Jul. 5, 2010 (KR) ........................ 10-2010-0064190

(51) Int. Cl.
- *G09G 3/30* (2006.01)
- *G06F 3/038* (2013.01)
- *H01J 29/10* (2006.01)
- *H01J 1/62* (2006.01)
- *G09G 3/10* (2006.01)
- *H01L 51/52* (2006.01)
- *H01L 27/32* (2006.01)

(52) U.S. Cl.
CPC ........... *H01L 27/329* (2013.01); *H01L 27/3248* (2013.01); *H01L 27/3223* (2013.01); *H01L 51/5212* (2013.01)
USPC ............... 345/80; 345/205; 345/76; 345/211; 313/463; 313/500; 315/169.3

(58) Field of Classification Search
USPC ................... 345/36, 45, 55, 76–81, 211, 205; 313/463, 500; 315/169.3
See application file for complete search history.

(56) References Cited

U.S. PATENT DOCUMENTS

| | | | |
|---|---|---|---|
| 7,394,446 B2 * | 7/2008 | Park | 345/92 |
| 2003/0085405 A1 * | 5/2003 | Park | 257/72 |

(Continued)

FOREIGN PATENT DOCUMENTS

| | | |
|---|---|---|
| KR | 10-2003-0037654 | 5/2003 |
| KR | 10-2006-0059745 A | 6/2006 |

(Continued)

OTHER PUBLICATIONS

KIPO Office action dated Sep. 4, 2012 for Korean Patent Application No. 10-2010-0064190 (1 sheet).

(Continued)

*Primary Examiner* — Lun-Yi Lao
*Assistant Examiner* — Jarurat Suteerawongsa
(74) *Attorney, Agent, or Firm* — Christie, Parker & Hale, LLP

(57) ABSTRACT

An organic electroluminescent display device capable of improving yield by preventing voltage drop of a power supply wire and a manufacturing method of the same. An organic electroluminescent display device according to an exemplary embodiment of the present invention includes: a plurality of sub-pixels defined by an active area displaying an image and an inactive area other than the active area; a driving switching element formed in the inactive area of the sub-pixel to supply driving current; and a power supply wire supplying power to the sub-pixel, wherein the power supply wire includes a first power supply wire extending in a vertical direction at one portion of a long side of the sub-pixel, a dummy power supply wire disposed on the first power supply wire and electrically connected with the first power supply wire, and a second power supply wire extending in a horizontal direction at one portion of a short side of the sub-pixel.

12 Claims, 6 Drawing Sheets

(56) References Cited

U.S. PATENT DOCUMENTS

2008/0117146 A1    5/2008   Iida et al.
2010/0127257 A1*   5/2010   Ryu et al. .................. 257/43
2011/0157110 A1*   6/2011   Chou et al. ................ 345/205

FOREIGN PATENT DOCUMENTS

| KR | 10-0611153      | 8/2006 |
| KR | 10-2008-0045051 | 5/2008 |
| KR | 10-0858610 B1   | 9/2008 |
| KR | 10-2010-0049385 | 5/2010 |

OTHER PUBLICATIONS

KR Office Action dated Feb. 23, 2012 for KR Application No. 10-2010-0064190 (3 pgs).

KR Patent Abstract Pub. No. 10-2005-0051444 A for KR Registration No. 10-0611153 listed above(1 pg).

* cited by examiner

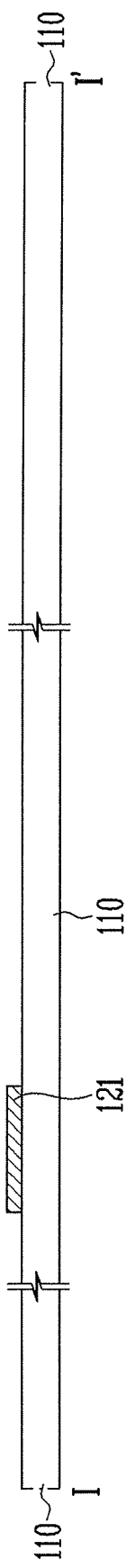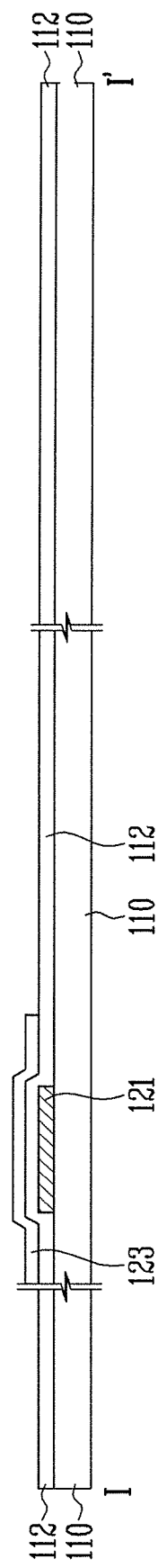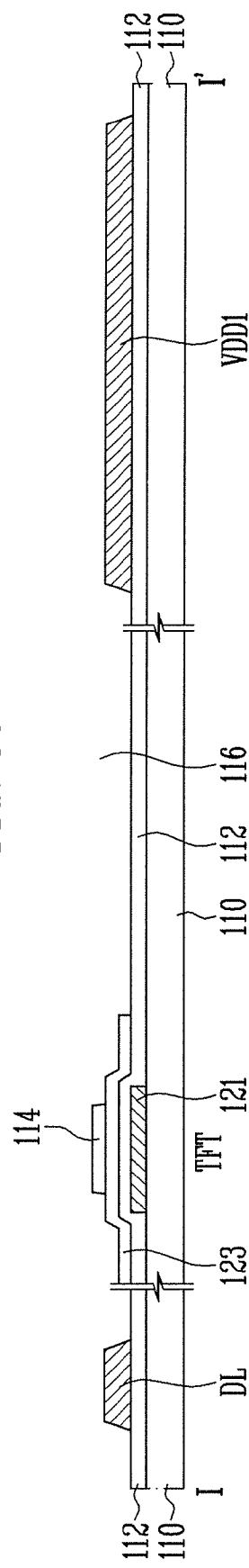

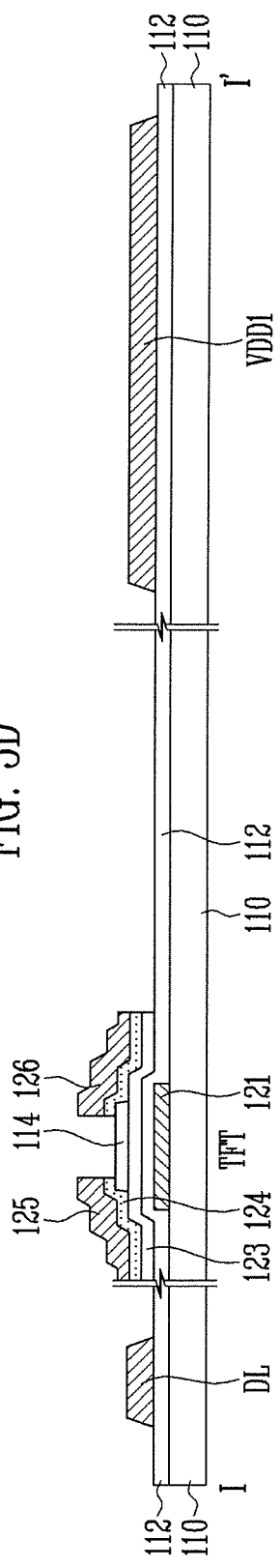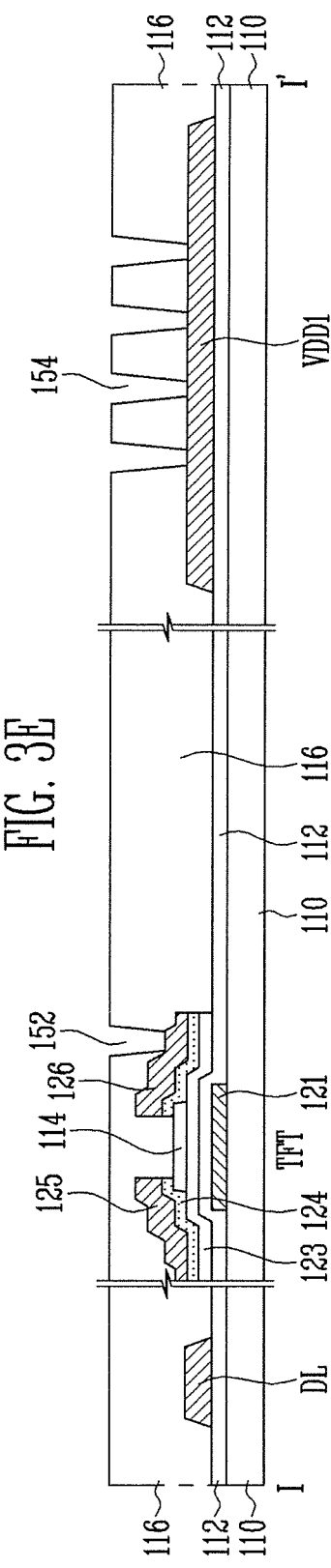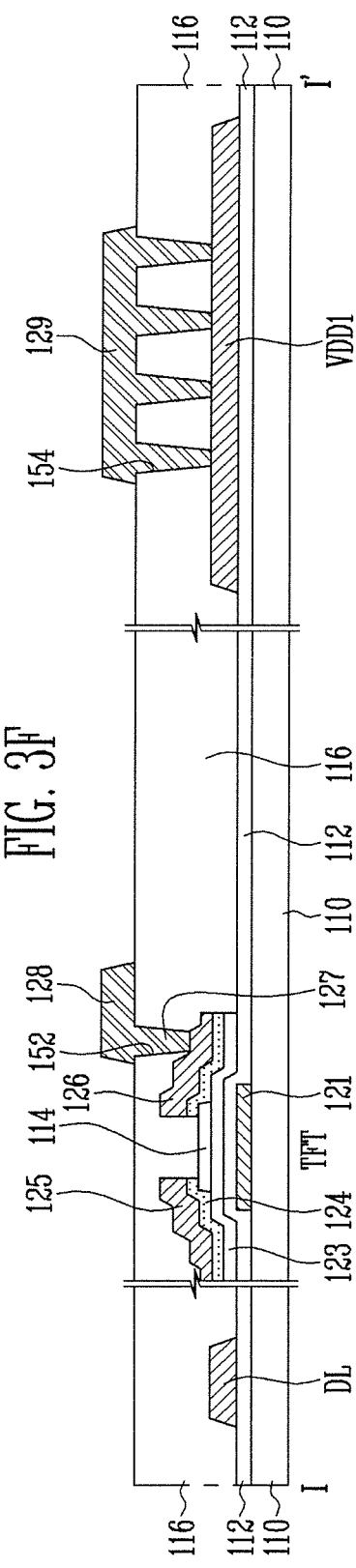

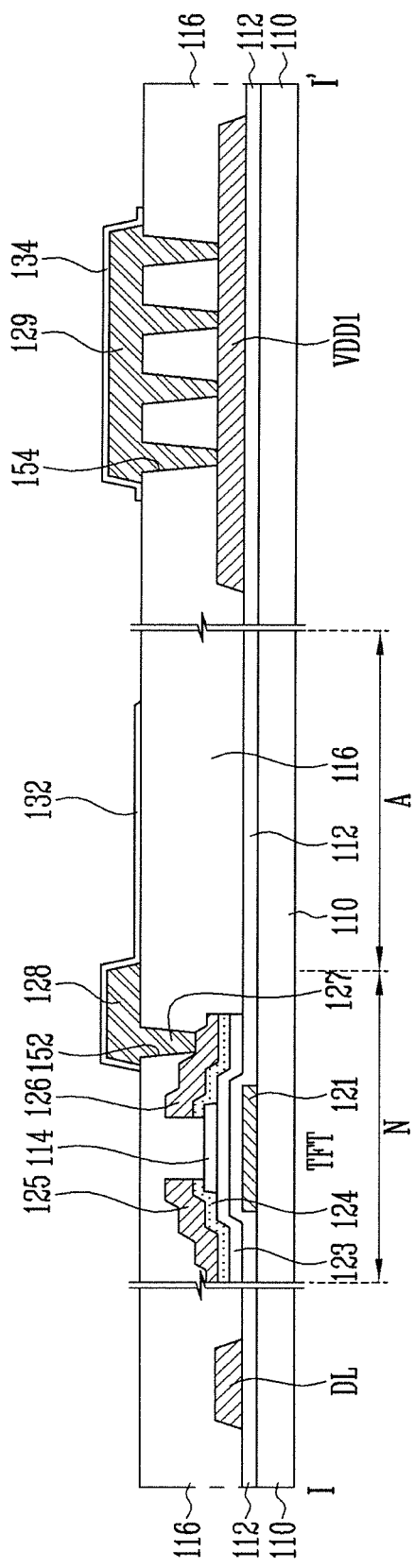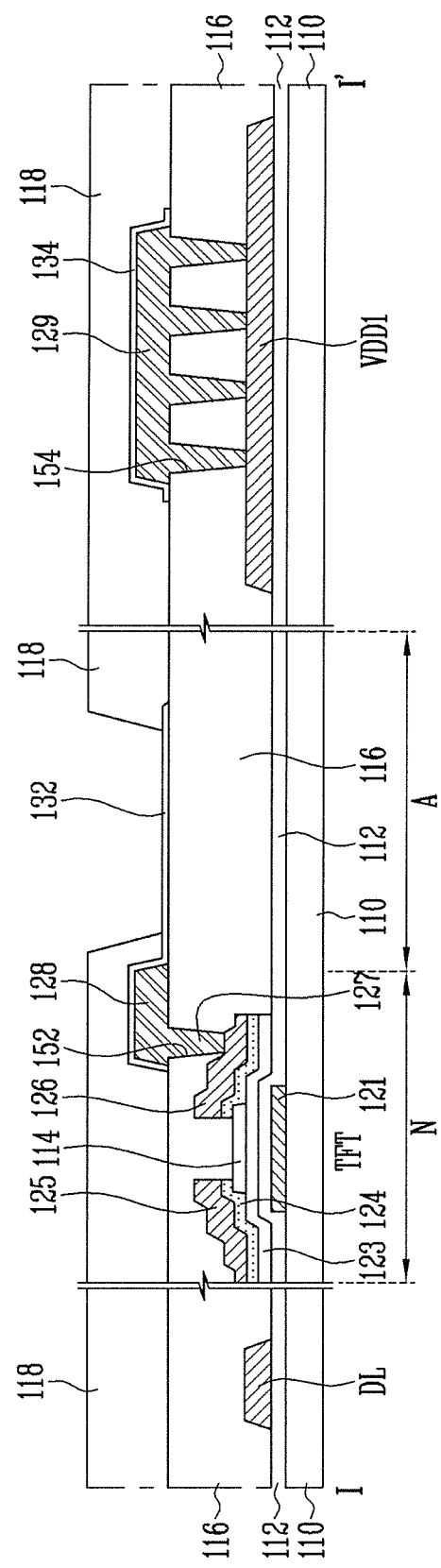

ORGANIC ELECTROLUMINESCENT DISPLAY DEVICE AND MANUFACTURING METHOD OF THE SAME

CROSS-REFERENCE TO RELATED APPLICATION

This application claims priority to and the benefit of Korean Patent Application No. 10-2010-0064190, filed on Jul. 5, 2010, in the Korean Intellectual Property Office, the entire content of which is incorporated herein by reference.

BACKGROUND

1. Field

Embodiments according to the present invention relate to an organic electroluminescent display device and a manufacturing method of the same.

2. Description of the Related Art

In recent years, various types of requirements for display devices have been increasing as the information society evolves. Accordingly, researches have been in progress for liquid crystal display devices (LCDs), plasma display panels (PDPs), field emission display devices (FEDs), electrophoretic display devices (EPDs), organic electroluminescent devices, and the like.

An organic light emitting display uses an organic light emitting device (e.g., organic light emitting diode (OLED)), which generates light by recombination of electrons provided from a cathode and holes provided from an anode.

The organic light emitting display has rapid response speed and excellent luminance, and can implement low-voltage driving and implement all colors of a visible region so as to meet diversified tastes of modern people.

The organic light emitting display includes a power supply wire which supplies power to a plurality of sub pixels located at crossing regions of gate wires and data wires which cross each other. The power supply wire serves as a terminal of a storage capacitor for storing data transferred through a wire and also as a passage through which a current flowing through a driving transistor is stably discharged to the outside.

In the case of a large screen, a voltage drop is generated by the resistance of the power supply wire such that voltage may not be applied uniformly to pixels, and luminance may vary in the display. When the voltage drop (IR drop) which is generated in the power supply wire is small, image quality on a display panel may be uniform. As a result, the resistance of the power supply wire should be minimized by a method of maximizing a line width of the power supply wire as a method for enhancing the uniformity of the image quality.

However, in a layout configuration of an array unit, as the line width of the power supply wire increases, a possibility that a short-circuit will occur among various wires made of metallic materials such as the power supply wire, data wires, or other wires increases. Therefore, there is a limit to increasing the line width of the power supply wire.

SUMMARY

Aspects of embodiments of the present invention provide an organic electroluminescent display device capable of improving yield by preventing or reducing voltage drop of a power supply wire and a manufacturing method of the same.

An exemplary embodiment of the present invention provides an organic electroluminescent display device including: a plurality of sub-pixels, each of the sub-pixels including an active area for displaying an image and an inactive area other than the active area, wherein a driving switching element is in the inactive area and is configured to supply a driving current; and a power supply wire for supplying power to the sub-pixels, wherein the power supply wire includes a first power supply wire extending in a first direction along long sides of the sub-pixels, a dummy power supply wire on the first power supply wire and electrically connected with the first power supply wire; and a second power supply wire extending in a second direction along short sides of the sub-pixels.

The dummy power supply wire may include an opaque conductive material.

The dummy power supply wire may include a same material as a dummy electrode electrically connected with the driving switching element.

The dummy power supply wire may be formed at the same layer as the dummy electrode electrically connected with the driving switching element.

The dummy power supply wire may have a stacked structure of MoW, AlNd, and MoW.

The dummy power supply wire may be electrically connected with the first power supply wire through a plurality of contact holes formed through a protection layer which is on the first power supply wire, and may be overlapped with the first power supply wire with the protection layer interposed therebetween.

A width of the dummy power supply wire may be smaller than a width of the first power supply wire.

The organic electroluminescent display device may further include a protection electrode on the dummy power supply wire and may cover the dummy power supply wire. The protection electrode may include a transparent conductive material.

The protection electrode may include a same material as an anode of an organic light emitting diode driven by a driving signal of the driving switching element.

Another embodiment of the present invention provides a manufacturing method of an organic electroluminescent display device that includes: sequentially forming a gate electrode, a gate insulating layer, and a semiconductor layer overlapped with the gate electrode on a substrate; forming a data line and a first power supply wire while forming a driving switching element by forming a source electrode and a drain electrode on the semiconductor layer, the source electrode and the drain electrode being spaced from each other and being partially overlapped with respective sides of the gate electrode; forming a protection layer on a substantially entire surface of the substrate, the first protection layer having a first contact hole exposing the drain electrode and a plurality of second contact holes exposing the first power supply wire; forming a connection electrode and a dummy electrode which are electrically connected with the drain electrode exposed through the first contact hole and a dummy power supply wire electrically connected with the first power supply wire exposed through the plurality of second contact holes; and forming an anode on the dummy electrode and forming a protection electrode on the dummy power supply wire.

The dummy power supply wire may include an opaque conductive material. The dummy power supply wire may have a stacked structure of MoW, AlNd, and MoW. The dummy power supply wire may be formed on the same layer as the dummy electrode. The dummy power supply wire may include the same material as the dummy electrode. The dummy power supply wire may be formed by the same process as the dummy electrode.

The dummy power supply wire may be overlapped with the first power supply wire, and a width of the dummy power supply wire may be smaller than a width of the first power supply wire.

The protection electrode may include a transparent conductive material and may be formed at the same time as the anode.

According to one exemplary embodiment of the present invention, a dummy power supply wire is formed on a power supply wire to reduce the resistance of the power supply wire, thereby uniformly and stably the image quality of an organic electroluminescent display device by solving voltage drop.

Furthermore, according to one exemplary embodiment of the present invention, the power supply wire is configured in a stacked structure to a line width of the power supply wire, thereby comparatively ensuring a layout margin of other wires.

Further, according to one exemplary embodiment of the present invention, the dummy power supply wire is made of the same material and formed by the same process as a dummy electrode used in a source-drain electrode process, thereby improving the voltage drop without an additional process.

According to one exemplary embodiment of the present invention, a protection electrode made of the same material as an anode is provided on the dummy power supply wire to prevent or protect the dummy power supply wire from being damaged without an additional process, thereby improving the reliability of the organic electroluminescent display device.

BRIEF DESCRIPTION OF THE DRAWINGS

The accompanying drawings, together with the specification, illustrate exemplary embodiments of the present invention, and, together with the description, serve to explain the principles of the present invention.

FIGS. 3A to 3H are cross-sectional views for describing a manufacturing method of the organic electroluminescent display device according to the first exemplary embodiment of the present invention shown in FIG. 1A.

DETAILED DESCRIPTION

Figure 1A:
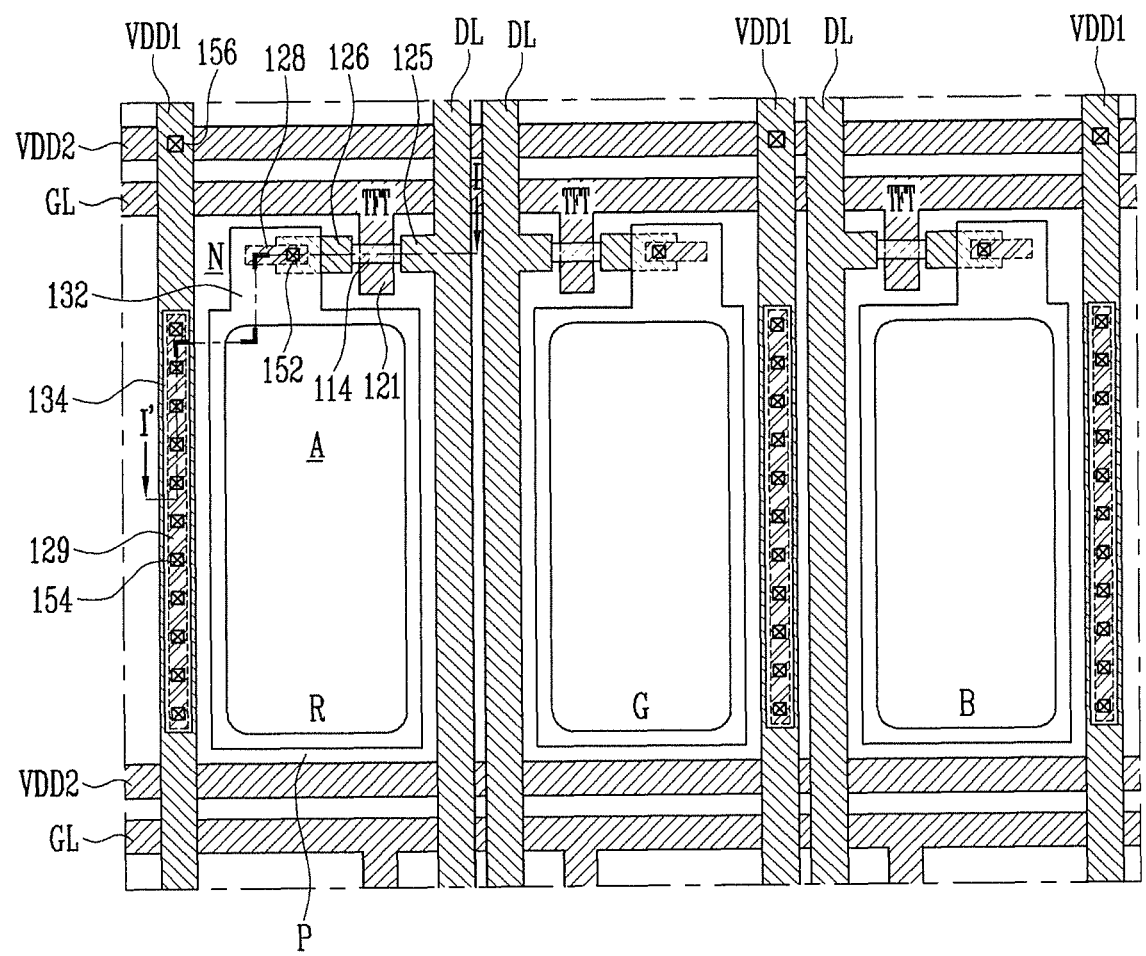
FIG. 1A is a layout diagram schematically illustrating an organic electroluminescent display device according to a first exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" or "coupled to" another element, it can be directly connected to the another element or be indirectly connected to the another element with one or more intervening elements interposed therebetween. Hereinafter, like reference numerals refer to like elements.

Hereinafter, an organic electroluminescent display device (e.g., an organic electroluminescence emitting display device or an organic light emitting display device) and a manufacturing method thereof according to exemplary embodiments of the present invention will be described in detail with reference to the accompanying drawings.

Herein, i) shapes, sizes, ratios, angles, numbers, etc. shown in the accompanying drawings are schematic and may be slightly varied within the scope of the invention. ii) Since the drawings are illustrated from an observer's point of view, the directions or positions illustrated in the drawings may be variously changed according to the position of the observer. iii) Same reference numerals may be assigned to the same part in different drawings.

iv) When 'comprising', 'including', 'having', 'constituting', etc. are used, another element may be added. One exception may arise if the term 'only' is used. v) When an element is described as a singularity, it may also be a plurality. vi) Although shapes, the comparison of sizes, a positional relationship, etc. are not described by 'approximately', 'substantially', etc., they are interpreted to include a typical error range.

vii) Although terms such as 'after', 'before', 'continually', 'in addition', 'herein', 'subsequently', 'at this time', etc. are used, the terms do not mean the limitation to any particular point in time. viii) Terms such as 'first', 'second', etc. re used merely for the convenience of referring to different parts selectively, exchangeably, or repeatedly, and should not be interpreted to be limited to any particular sequence or order.

ix) When the positional relationship between two parts is described by 'on~', 'above~', 'below~', 'beside~', etc., one or more other parts may be interposed between the two parts. One exception may arise if the term 'directly' is used. x) When the parts are electrically connected with each other by 'or~', the parts are interpreted singly or to include even a combination thereof.

Organic Electroluminescent Display Device

Hereinafter, an organic electroluminescent display device according to an exemplary embodiment of the present invention will be described primarily in reference to one sub-pixel among R, G, and B sub-pixels constituting one pixel, but can be applied to other sub-pixels formed in the organic electroluminescent display device according to the present invention.

Figure 1B:
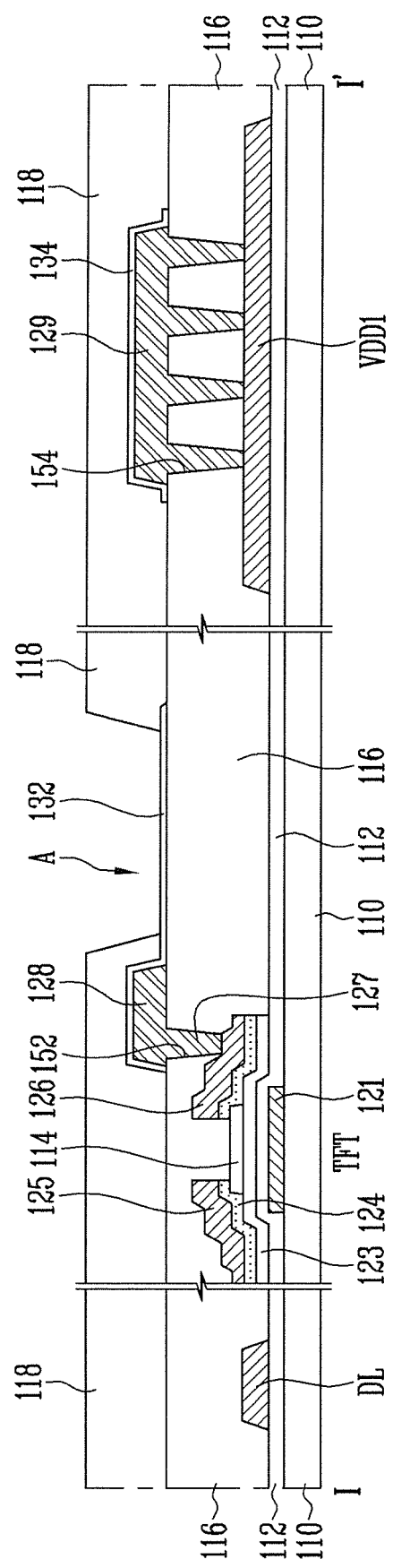
FIG. 1B is a cross-sectional view of the organic electroluminescent display device according to the first exemplary embodiment of the present invention taken along line I-I' of FIG. 1A.

Referring to FIGS. 1A and 1B, an organic electroluminescent display device according to a first exemplary embodiment of the present invention includes a plurality of sub-pixels P which are positioned at crossing regions of a plurality of gate lines GL and a plurality of data lines DL and power supply wires VDD1 and VDD2 which supply power to the plurality of sub-pixels P.

The sub-pixel P may be defined by an active area A for displaying an image and an inactive area N where various wires and switching elements other than the active area A are formed. The sub-pixel P includes a driving switching element TFT which is formed in the inactive area N and supplies driving current to an organic light emitting diode and the organic light emitting diode which is formed in the active area A and is driven in response to a signal of the driving switching element TFT.

The driving switching element TFT is formed in the inactive area N of a substrate 110 and includes semiconductor layers 123 and 124 which are overlapped with a gate electrode 121 with a gate insulating layer 112 interposed therebetween.

A channel (or channel region) is formed in the semiconductor layer 123 at a location corresponding to the gate electrode 121. In addition, the driving switching element TFT further includes source and drain electrodes 125 and 126 formed on the semiconductor layers 123 and 124 and an etch stopper 114 which is overlapped with the gate electrode 121 between the source and drain electrodes 125 and 126.

The gate electrode 121 and the source and drain electrodes 125 and 126 are made of an opaque conductive material. As the opaque conductive material of which the gate electrode 121 and the source and drain electrodes 125 and 126 are made, a single layer of molybdenum (Mo), tungsten (W), titanium (Ti), copper (Cu), aluminum (Al), neodymium (Nd), or chromium (Cr) or a single layer of an alloy thereof may be used. Further, the gate electrode 121 and the source and drain electrodes 125 and 126 may be formed in a multilayer structure made of the opaque conductive materials or a multilayer structure of the alloys.

Since the gate electrode 121 is protruded from the gate line GL, the gate electrode 121 may be made of the same material as the gate line GL. Further, the gate electrode 121 may be formed on the same layer as the gate line GL. Since the source/drain electrodes 125 and 126 are protruded from the data line DL, the source and drain electrodes 125 and 126 may be made of the same material as the data line DL. Further, the source/drain electrodes 125 and 126 may be formed on the same layer as the data line DL.

The source and drain electrodes 125 and 126 of the driving switching element TFT are electrically connected with an anode 132 of the organic light emitting diode through a connection electrode 127 and a dummy electrode 128 which penetrates through a first contact hole 152 formed on a protection layer 116. Here, the connection electrode 127 and the dummy electrode 128 may be made of the same opaque conductive material as the source and drain electrodes 125 and 126. In one embodiment, the connection electrode 127 and the dummy electrode 128 are formed in a stacking structure of MoW, AlNd, and MoW.

The driving switching element TFT is electrically connected with the anode 132 of the organic light emitting diode through the connection electrode 127 and the dummy electrode 128 to control an amount of current which flows through the organic light emitting diode.

The organic light emitting diode (which includes the active area A of FIG. 1A) emits light of red, green, or blue color as the current of the driving switching element TFT flows to display image information (e.g., predetermined image information), and includes the anode 132, a cathode which is an opposing electrode, and an organic emission layer which is interposed therebetween to emit light.

The anode 132 is formed on the protection layer 116 and the connection electrode 127 of the inactive area N and on the protection layer 116 of the active area A. The anode 132 is made of a transparent conductive material to allow light emitted from the organic emission layer to be emitted outside of the display device. As the transparent conductive material, indium tin oxide (ITO), tin oxide (TO or $SnO_2$), indium zinc oxide (IZO), indium tin zinc oxide (ITZO), or a combination thereof may be used.

The anode 132 is formed on the dummy electrode 128 which is made of the same opaque conductive material as the source and drain electrodes 125 and 126, and is electrically connected with the dummy electrode 128. Therefore, a resistance component of the anode 132 which is made of a transparent conductive material may be compensated for. That is, the dummy electrode 128 which is made of an opaque conductive material reduces a resistance difference between the anode 132 made of the transparent conductive material and the source and drain electrodes 125 and 126 made of the opaque conductive material.

A planarization layer 118 which is formed on a generally overall (or entire) surface of the substrate 110 to cover the anode 132 exposes the active area A. The organic emission layer is formed in the exposed active area A and is divided by the unit of the sub-pixel P and emits red, green, and blue lights in units of the sub-pixels P to display an image. The organic emission layer emits light while excitons formed by combining holes and electrons which are injected from the anode 132 and the cathode, respectively, fall to a ground state.

The cathode is electrically connected to the power supply wires VDD1 and VDD2 and is formed on the overall surface of the substrate 110. The cathode, for example, may be made of the opaque conductive material or the transparent conductive material depending on an emission direction of the organic emission layer.

The power supply wires which are electrically connected with the cathode of the organic light emitting diode include the first power supply wire VDD1, the second power supply wire VDD2, and a dummy power supply wire 129.

The first power supply wire VDD1 extends in a vertical direction at one portion of a long side of the plurality of sub-pixels P. The first power supply wire VDD1 is arranged spaced apart from and in parallel to the data line DL between the horizontally adjacent sub-pixels P or a first power supply wire VDD1 of an adjacent sub-pixel P.

The first power supply wire VDD1 may be made of the opaque conductive material and made of the same material as the source and drain electrodes 125 and 126 or the data line DL. The first power supply wire VDD1 may be formed on the same layer as the source/drain electrodes 125 and 126 or the data line DL.

The dummy power supply wire 129 is overlapped with the first power supply wire VDD1 with the protection layer 116 interposed therebetween and is electrically connected with the first power supply wire VDD1 through a plurality of second contact holes 154 formed through the protection layer 116. Here, the dummy power supply wire 129 is made of the opaque conductive material to reduce the resistance of the electrically connected first power supply wire VDD1, thereby preventing or reducing the voltage drop (e.g., IR drop) of the first power supply wire VDD1.

The dummy power supply wire 129 is made of the same opaque conductive material and formed on the same layer as the dummy electrode 128 which electrically connects the driving switching element TFT and the anode 132 of the organic light emitting diode to each other. In one embodiment, the dummy power supply wire 129 is formed as a stacked structure of MoW, AlNd, and MoW.

In FIG. 1, the dummy power supply wire 129 is formed on the first power supply wire VDD1. In one embodiment, there is no transparent conductive material and a layout margin is ensured, the dummy power supply wire 129 may be formed (or may also be formed) on the second power supply wire VDD2.

In the described embodiment, the width of the dummy power supply wire 129 is smaller than the width of the first power supply wire VDD1 by the layout margin and the length of the dummy power supply wire 129 is smaller than the length of the sub-pixel P. A protection electrode 134 for protecting the dummy power supply wire 129 from being etched at the time of performing an etching process is located on the dummy power supply wire 129. The protection electrode 134 may be made of the same transparent conductive material as the anode 132.

As such, in one exemplary embodiment of the present invention, since the IR drop is reduced or solved by forming the dummy power supply wire 129 on the first power supply wire VDD1 and/or the second power supply wire VDD2, it is possible to uniformly and stably drive the image quality of the organic electroluminescent display device. Further, in an exemplary embodiment of the present invention, the line width of the first power supply wire VDD1 is reduced by configuring the dummy power supply wire 129 on the first power supply wire VDD1 and/or the second power supply wire VDD2 in a stacking structure so as to comparatively ensure layout margins of other wires.

The second power supply wire VDD2 extends in a horizontal direction at one portion of a short side of the plurality of sub-pixels P. The second power supply wire VDD2 is disposed between vertically adjacent sub-pixels P and arranged spaced apart from and in parallel to the gate line GL to be electrically connected with the first power supply wire VDD1 through a third contact hole 156.

The second power supply wire VDD2 may be made of an opaque conductive material and made of the same material as the source and drain electrodes 125 and 126 or the data line DL. The second power supply wire VDD2 may be formed on the same layer as the source/drain electrodes 125 and 126 or the data line DL.

Figure 2:
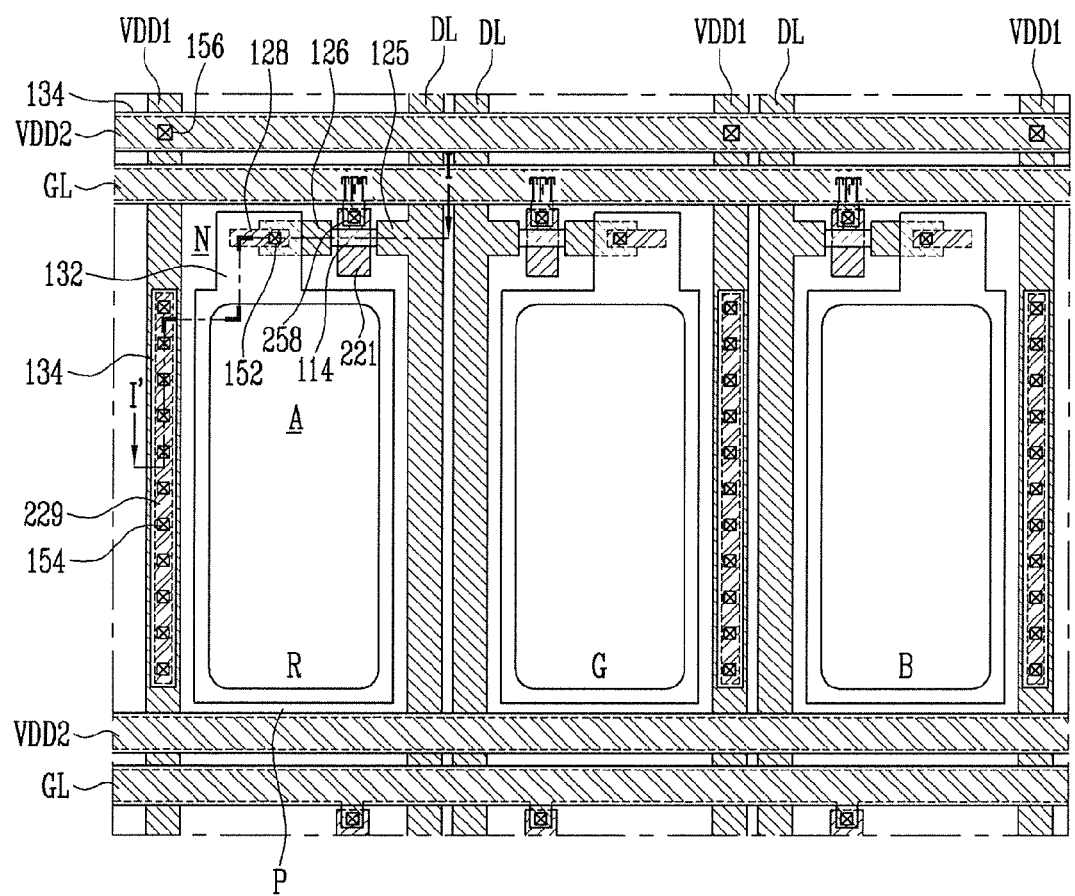
FIG. 2 is a layout diagram schematically illustrating an organic electroluminescent display device according to a second exemplary embodiment of the present invention.

Referring to FIG. 2, an organic electroluminescent display device according to a second exemplary embodiment of the present invention includes a plurality of sub-pixels P which are positioned at crossing regions of a plurality of gate lines GL and a plurality of data lines DL, and power supply wires which supply power to the plurality of sub-pixels P. The power supply wires include a first power supply wire VDD1 and a second power supply wire VDD2.

The organic electroluminescent display device according to the second exemplary embodiment of the present invention is substantially the same as the organic electroluminescent display device according to the first exemplary embodiment in components and descriptions thereof except for the gate line GL, the second power supply wire VDD2, the dummy power supply wire 229, and a connection structure of the gate line GL and the gate electrode 221. Therefore, like elements refer to like reference numerals and a description of like reference numerals will be omitted.

The gate line GL and the second power supply wire VDD2 of the organic electroluminescent display device according to the second exemplary embodiment of the present invention are made of the same material and formed on the same layer as the connection electrode electrically connecting the driving switching element TFT and the anode 132 to each other, the dummy electrode 128, or the dummy power supply wire 129. As a result, the gate line GL and the gate electrode 221 are electrically connected to each other through a contact hole 258.

The first power supply wire VDD1 extends in a vertical direction (e.g., a column direction) at one portion of a long side of a plurality of sub-pixels P. The first power supply wire VDD1 is arranged spaced apart from and in parallel to the data line DL between the horizontally adjacent sub-pixels P or a first power supply wire VDD1 of an adjacent sub-pixel P.

The first power supply wire VDD1 may be made of an opaque conductive material and may be made of the same material as the source and drain electrodes 125 and 126 or the data line DL in view of the manufacturing process. The first power supply wire VDD1 may be formed on the same layer as the source/drain electrodes 125 and 126 or the data line DL.

The dummy power supply wire 229 is overlapped with the first power supply wire VDD1 and is electrically connected with the first power supply wire VDD1 through a plurality of second contact holes 154 which are formed through a protection layer. Here, the dummy power supply wire 229 is made of the opaque conductive material to reduce the resistance of the electrically connected first power supply wire VDD1, thereby preventing or reducing the voltage drop (e.g., IR drop) of the first power supply wire VDD1.

The dummy power supply wire 229 is made of the same opaque conductive material and formed on the same layer as the dummy electrode which electrically connects the driving switching element TFT and the anode 132 of the organic light emitting diode to each other. In one embodiment, the dummy power supply wire 229 is formed in a stacked structure of MoW, AlNd, and MoW.

The dummy power supply wire 229 is disposed at an area where a layout margin is ensured without the transparent conductive material. In one embodiment, since a protection electrode 134 is formed on the second power supply wire VDD2, the dummy power supply wire 229 is formed only on the first power supply wire VDD1.

In the described embodiment, the width of the dummy power supply wire 229 is smaller than the width of the first power supply wire VDD1 by the layout margin and the length of the dummy power supply wire 229 is smaller than the length of the long side of the sub-pixel P. The protection electrode 134 for protecting the dummy power supply wire 229 from being etched at the time of performing an etching process is located on the dummy power supply wire 229. The protection electrode 134 may be made of the same transparent conductive material as the anode 132.

As such, in one exemplary embodiment of the present invention, since the IR drop is solved or reduced by forming the dummy power supply wire 229 on the first power supply wire VDD1 and/or the second power supply wire VDD2, it is possible to uniformly and stably drive the image quality of the organic electroluminescent display device. Further, in one exemplary embodiment of the present invention, the line width of the first power supply wire VDD1 is reduced by configuring the dummy power supply wire 229 on the first power supply wire VDD1 in a stacked structure so as to comparatively ensure layout margins of other wires.

Manufacturing Method of Organic Electroluminescent Display Device

Hereinafter, a manufacturing method of the organic electroluminescent display device shown in FIG. 1A will be described with reference to FIGS. 3A to 3H.

Referring to FIG. 3A, a first conductive material is first deposited on a substrate 110 and thereafter, a first opaque conductive material is patterned by a photolithography process and an etching process to form a gate electrode 121.

As the first opaque conductive material, a single layer of molybdenum (Mo), tungsten (W), titanium (Ti), copper (Cu), aluminum (Al), neodymium (Nd), or chromium (Cr), a single layer of an alloy thereof, a multilayer structure of the above metals, or a multilayer structure of alloys thereof may be used. Meanwhile, before forming the gate electrode 121 by using the first opaque conductive material, a process of forming a buffer layer for preventing or reducing etching damage on the substrate 110 may be performed.

Referring to FIG. 3B, a gate insulating layer 112 and an amorphous silicon layer are sequentially deposited on an overall (or entire) surface of the substrate 110 where the gate electrode 121 is formed and thereafter, the amorphous silicon layer is crystallized and patterned to form a first semiconductor layer 123.

The gate insulating layer 112 may be formed on the overall surface of the substrate 110 where the gate electrode 121 may be formed as a single layer of an inorganic insulating material such as a silicon nitride film (SiNx), a silicon oxide film (SiO$_2$), and the like or a multilayer thereof. The first semiconductor layer 123, which may be a crystallized amorphous silicon layer, is overlapped with the gate electrode 121 with the gate insulating layer 112 interposed therebetween.

Referring to FIG. 3C, an insulating material layer is deposited on the substrate 110 where the first semiconductor layer 123 is formed, and thereafter, is patterned through the photolithography and etching processes to form an etch stopper 114 on the first semiconductor layer 123 that is overlapped with the gate electrode 121. The etch stopper 114 is used for preventing or protecting a channel region from being damaged in the etching process.

Referring to FIG. 3D, an n+ layer and a second opaque conductive material are deposited on the overall surface of the substrate 110 including the etch stopper 114 and thereafter, is patterned through the photolithography and etching processes to form a second semiconductor layer 124, and a source electrode 125 and a drain electrode 126, thereby completing a driving switching element TFT. At this time, a data line DL and a first power supply wire VDD1 are also formed on the gate insulating layer 112.

The source electrode 125 and the drain electrode 126 are horizontally spaced apart from each other and are partially overlapped with respective sides of the etch stopper 114, and are also partially overlapped with respective sides of the gate electrode 121 with the first semiconductor layer 123 and the second semiconductor layer 124 interposed therebetween.

As a second opaque conductive material, a single layer of molybdenum (Mo), tungsten (W), titanium (Ti), copper (Cu), aluminum (Al), neodymium (Nd), or chromium (Cr), a single layer of an alloy thereof, a multilayer structure of two or more of the above metals, or a multilayer structure of alloys thereof may be used. The second semiconductor layer 124 is formed by an n+ doped amorphous silicon layer.

Referring to FIG. 3E, the protection layer 116 is deposited on the overall surface of the substrate 110 where the driving switching element TFT, the data line DL, and the first power supply wire VDD1 are formed and thereafter, patterned through the photolithography and etching processes to form a first contact hole 152 and a plurality of second contact holes 154.

The first contact hole 152 exposes a drain electrode 126 of the driving switching element and the plurality of second contact holes 154 expose the first power supply wire VDD1. The protection layer 116, for example, may be formed by a single layer such as a silicon oxide film SiO$_2$ or a silicon nitride film SiNx or a multilayer thereof through a PECVD deposition method.

Referring to FIG. 3F, a third opaque conductive material is deposited on the substrate 110, and thereafter, is patterned through the photolithography and etching processes to form a connection electrode 127, a dummy electrode 128, and a dummy power supply wire 129 concurrently (e.g., at the same time).

As a third opaque conductive material, a single layer of molybdenum (Mo), tungsten (W), titanium (Ti), copper (Cu), aluminum (Al), neodymium (Nd), or chromium (Cr), a single layer of an alloy thereof, a multilayer structure of two or more of the above metals, or a multilayer structure of alloys thereof may be used.

The connection electrode 127 is formed in the first contact hole 152 to be electrically connected with the drain electrode 126 exposed through the first contact hole 152 and the dummy electrode 128 is formed on the connection electrode 127 and the protection layer 116 to be electrically connected with the connection electrode 127. Here, the connection electrode 127 and the dummy electrode 128 are integrally formed by the same material. In one embodiment, the connection electrode 127 and the dummy electrode 128 are made of the same material as the source and drain electrodes 125 and 126 in order to reduce or prevent incurring additional process cost.

The dummy power supply wire 129 is formed on the protection layer 116 to be overlapped with the first power supply wire VDD1 with the protection layer 116 interposed therebetween. Some of the material for the dummy power supply wire 129 fills the second contact holes 154, such that the dummy power supply wire 129 is electrically connected with the first power supply wire VDD1 exposed through the plurality of second contact holes 154. Here, the dummy power supply wire 129 is made of the third opaque conductive material to reduce the resistance of the electrically connected first power supply wire VDD1, thereby preventing or reducing the voltage drop (e.g., IR drop) of the first power supply wire VDD1.

As such, in one exemplary embodiment of the present invention, since the IR drop is reduced or solved by forming the dummy power supply wire 129 on the first power supply wire VDD1 and/or the second power supply wire VDD2, it is possible to stably drive the organic electroluminescent display device to achieve a substantially uniform image quality. Further, in one exemplary embodiment of the present invention, the line width of the first power supply wire VDD1 is reduced by configuring the dummy power supply wire 129 on the first power supply wire VDD1 and/or the second power supply wire VDD2 in a stacked structure so as to comparatively ensure layout margins of other wires.

The dummy power supply wire 129 may be formed in a stacked structure of MoW, AlNd, and MoW at the same time as the connection electrode 127 and the dummy electrode 128. In one exemplary embodiment of the present invention, the dummy power supply wire 129 is made of the same material and is formed by the same process as the dummy electrode 128 so as to prevent or reduce the IR drop while simplifying a process without an additional process.

In one embodiment, the width of the dummy power supply wire 129 is smaller than the width of the first power supply wire VDD1 by a layout margin. Meanwhile, in FIG. 3F, the dummy power supply wire 129 is formed on the first power supply wire VDD1, but if there is no transparent conductive material and the layout margin is ensured, the dummy power supply wire 129 may be formed on the second power supply wire VDD2.

Referring to FIG. 3G, the transparent conductive material is deposited, and thereafter, is patterned through the photolithography and etching processes to form an anode 132 and a protection electrode 134. The anode 132 is formed on a dummy electrode 128 of an inactive area N and a protection layer 116 of an active area A, and is electrically connected with the drain electrode 126 of the driving switching element TFT.

Herein, one sub-pixel may be defined by the inactive area N where the driving switching elements TFT and wires are formed and the active area A for displaying an image with light emitted from an organic emission layer.

The protection electrode 134 is formed on the dummy power supply wire 129 to cover the dummy power supply wire 129 in order to protect or prevent the dummy power supply wire 129 from being damaged in the patterning process for forming the anode 132. According to one exemplary embodiment of the present invention, the protection electrode 134 made of the same material as the anode 132 is provided on the dummy power supply wire 129 to protect or prevent the dummy power supply wire 129 from being damaged without an additional process, thereby improving the reliability of the organic electroluminescent display device.

As the transparent conductive material of which the anode 132 and the protection electrode 134 are made, indium tin oxide (ITO), tin oxide (TO or $SnO_2$), indium zinc oxide (IZO), indium tin zinc oxide (ITZO), or a combination thereof may be used.

Referring to FIG. 3H, a planarization layer 118 is deposited on the overall surface of the substrate 110, and thereafter, an opening is formed to expose the anode 132 of the active area. The planarization layer 118 may be formed by a single layer such as a silicon oxide film $SiO_2$ or a silicon nitride film SiNx or a multilayer thereof through the PECVD deposition method.

Thereafter, an organic emission layer is formed in the active area A and a cathode electrically connected with the power supply wire is formed to complete the organic electroluminescent display device according to one exemplary embodiment of the present invention.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic electroluminescent display device comprising:
    a plurality of sub-pixels, each of the sub-pixels comprising an active area for displaying an image and an inactive area other than the active area, wherein a driving switching element is in the inactive area, and is configured to supply a driving current; and
    a power supply wire for supplying power to the sub-pixels, wherein the power supply wire comprises:
        a first power supply wire extending in a first direction along long sides of the sub-pixels;
        a dummy power supply wire on the first power supply wire and electrically connected with the first power supply wire; and
        a second power supply wire extending in a second direction along short sides of the sub-pixels, and
    a protection electrode on the dummy power supply wire, the protection electrode covering the dummy power supply wire,
    wherein the dummy power supply wire comprises an opaque conductive material, and
    wherein the protection electrode comprises a transparent conductive material and is a same material as an anode of an organic light emitting diode driven by a driving signal of the driving switching element.

2. The device of claim 1, wherein the dummy power supply wire comprises a same material as a dummy electrode electrically connected with the driving switching element.

3. The device of claim 1, wherein the dummy power supply wire is formed at the same layer as the dummy electrode electrically connected with the driving switching element.

4. The device of claim 1, wherein the dummy power supply wire has a stacked structure of MoW, AlNd, and MoW.

5. The device of claim 1, wherein the dummy power supply wire is electrically connected with the first power supply wire through a plurality of contact holes formed through a protection layer which is on the first power supply wire, and is overlapped with the first power supply wire with the protection layer interposed therebetween.

6. The device of claim 1, wherein a width of the dummy power supply wire is smaller than a width of the first power supply wire.

7. The device of claim 1, wherein the protection electrode comprises a transparent conductive material.

8. A manufacturing method of an organic electroluminescent display device, comprising:
    sequentially forming a gate electrode, a gate insulating layer, and a semiconductor layer overlapped with the gate electrode on a substrate;
    forming a data line and a first power supply wire while forming a driving switching element by forming a source electrode and a drain electrode on the semiconductor layer, the source electrode and the drain electrode being spaced from each other and being partially overlapped with respective sides of the gate electrode;
    forming a protection layer on a substantially entire surface of the substrate, the protection layer having a first contact hole exposing the drain electrode and a plurality of second contact holes exposing the first power supply wire, the protection layer contacting the drain electrode;
    forming a connection electrode and a dummy electrode which are electrically connected with the drain electrode exposed through the first contact hole and a dummy power supply wire electrically connected with the first power supply wire exposed through the plurality of second contact holes; and
    forming an anode on the dummy electrode and forming a protection electrode on the dummy power supply wire,
    wherein the dummy electrode and the connection electrode are made of a same material, and
    wherein the protection electrode comprises a transparent conductive material and is formed at the same time as the anode.

9. The method of claim 8, wherein the dummy power supply wire comprises an opaque conductive material.

10. The method of claim 8, wherein the dummy power supply wire has a stacked structure of MoW, AlNd, and MoW.

11. The method of claim 8, wherein the dummy power supply wire is formed on the same layer and by the same process as the dummy electrode.

12. The method of claim 8, wherein the dummy power supply wire is overlapped with the first power supply wire, and a width of the dummy power supply wire is smaller than a width of the first power supply wire.

* * * * *